(12) United States Patent
Chen et al.

(10) Patent No.: US 11,296,141 B2
(45) Date of Patent: Apr. 5, 2022

(54) IMAGE CAPTURING ASSEMBLY AND PACKAGING METHOD THEREOF, LENS MODULE, AND ELECTRONIC DEVICE

(71) Applicant: Ningbo Semiconductor International Corporation, Ningbo (CN)

(72) Inventors: Da Chen, Ningbo (CN); Mengbin Liu, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 120 days.

(21) Appl. No.: 16/236,840

(22) Filed: Dec. 31, 2018

(65) Prior Publication Data
US 2020/0161346 A1 May 21, 2020

Related U.S. Application Data

(63) Continuation of application No. PCT/CN2018/119984, filed on Dec. 10, 2018.

(30) Foreign Application Priority Data

Nov. 20, 2018 (CN) .......................... 201811386733.8

(51) Int. Cl.
*H01L 27/146* (2006.01)
*H01L 23/00* (2006.01)
*H01L 31/18* (2006.01)

(52) U.S. Cl.
CPC .......... *H01L 27/1469* (2013.01); *H01L 24/48* (2013.01); *H01L 27/1462* (2013.01); *H01L 27/14618* (2013.01); *H01L 27/14627* (2013.01); *H01L 27/14634* (2013.01); *H01L 27/14636* (2013.01); *H01L 27/14685* (2013.01); *H01L 31/1892* (2013.01); *H01L 2224/48139* (2013.01)

(58) Field of Classification Search
None
See application file for complete search history.

(56) References Cited

U.S. PATENT DOCUMENTS

2008/0308928 A1* 12/2008 Chang ..................... H01L 24/24
257/723
2010/0304530 A1* 12/2010 Yim ...................... H01L 25/105
438/109
2012/0038813 A1 2/2012 Jung et al.
2012/0178214 A1* 7/2012 Lam ........................ H01L 24/32
438/118

(Continued)

FOREIGN PATENT DOCUMENTS

| CN | 103456754 A | 12/2013 |
| CN | 103700634 A | 4/2014 |
| CN | 203895459 U | 10/2014 |

(Continued)

*Primary Examiner* — Alexander G Ghyka
(74) *Attorney, Agent, or Firm* — Anova Law Group, PLLC

(57) ABSTRACT

The present disclosure provides an image capturing assembly and its packaging method, a lens module and an electronic device. The packaging method includes: providing a photosensitive chip; mounting an optical filter on the photosensitive chip; providing a carrier substrate and temporarily bonding the photosensitive chip and functional components on the carrier substrate; and forming an encapsulation layer on the carrier substrate and at least between the photosensitive chip and the functional components.

13 Claims, 6 Drawing Sheets

(56) References Cited

U.S. PATENT DOCUMENTS

2013/0320471 A1* 12/2013 Luan ................ H01L 27/14618
  257/432
2018/0294299 A1* 10/2018 Baek ................ H01L 27/14643

FOREIGN PATENT DOCUMENTS

| CN | 105244359 A | 1/2016 |
| CN | 106206485 A | 12/2016 |
| CN | 107958881 A | 4/2018 |

* cited by examiner

IMAGE CAPTURING ASSEMBLY AND PACKAGING METHOD THEREOF, LENS MODULE, AND ELECTRONIC DEVICE

CROSS-REFERENCES TO RELATED APPLICATIONS

This application is a continuation application of PCT Patent Application No. PCT/CN2018/119984, filed on Dec. 10, 2018, which claims priority to Chinese patent application No. 201811386733.8, filed on Nov. 20, 2018, the entirety of all of which is incorporated herein by reference.

FIELD OF THE DISCLOSURE

The present disclosure generally relates to the field of lens module and, more particularly, relates to an image capturing assembly and its packaging method, a lens module, and an electronic device.

BACKGROUND

With continuous improvements of people's living standards, people have more free time to enjoy their leisure life. Photography has become a common way for people to record their outings and daily life. Therefore, electronic devices with image capturing functions (e.g., mobile phones, tablets, and cameras) are widely used in people's daily life and work and are gradually become indispensable tools for people nowadays.

Electronic devices with image capturing functions are often configured with lens modules. The design level of lens modules plays an important role for determining the image capturing quality. The lens module often includes an image capturing assembly with photosensitive chips and a lens assembly mounted on the image capturing assembly which is used to capture images of photographed objects.

In addition, to improve the imaging capability of lens modules, photosensitive chips with large imaging areas are required, and the lens modules are generally equipped with passive components such as resistors and capacitors, and peripheral chips.

BRIEF SUMMARY OF THE DISCLOSURE

One aspect of the present disclosure provides a packaging method for an image capturing assembly. The method includes: providing a photosensitive chip; mounting an optical filter on the photosensitive chip; providing a carrier substrate and temporarily bonding the photosensitive chip and functional components on the carrier substrate; and forming an encapsulation layer on the carrier substrate and at least between the photosensitive chip and the functional components.

Another aspect of the present disclosure provides an image capturing assembly. The image capturing assembly includes: an encapsulation layer; and a photosensitive unit and functional components, embedded in the encapsulation layer. The photosensitive unit includes a photosensitive chip and an optical filter mounted on the photosensitive chip. A bottom surface of the encapsulation layer at least exposes the photosensitive chip and the functional components.

Another aspect of the present disclosure provides a lens module. The lens module includes: the disclosed image capturing assembly; and a lens assembly including a holder mounted on the upper surface of the encapsulation layer and surrounding the photosensitive unit and the functional components. The lens assembly is electrically connected with the photosensitive chip and the functional components.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
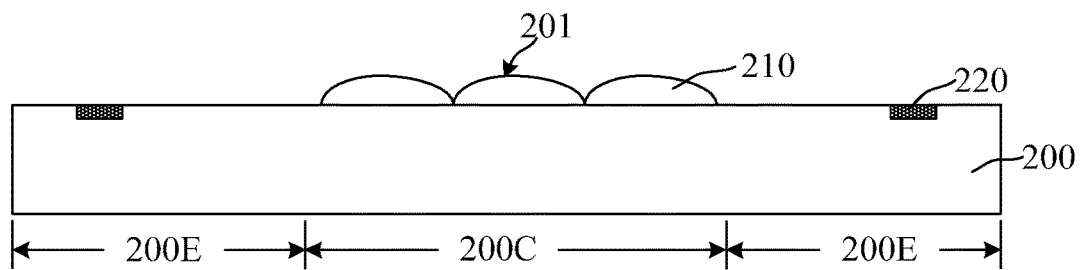
FIGS. 1-9 illustrate structural schematics corresponding to structures at certain stages of an exemplary packaging method for image capturing assembly according to various disclosed embodiments of the present disclosure.

Reference will now be made in detail to exemplary embodiments of the disclosure, which are illustrated in the accompanying drawings. Wherever possible, the same reference numbers will be used throughout the drawings to refer to the same or like parts.

Currently, the performance of lens modules needs to be improved and lens modules are difficult to meet the requirements of miniaturization and ultra-thin thickness.

The conventional lens module may be made of a circuit board, a photosensitive chip, functional components (e.g., a peripheral chip) and a lens assembly. The peripheral chip may be mounted on a peripheral motherboard. The photosensitive chip and the functional components may be separated from each other, where the circuit board may be used to support the photosensitive chip, functional components and the lens assembly, and also the electrical connection between the photosensitive chip, functional components and the lens module may be implemented by the circuit board.

However, with the requirements of high-pixel and ultra-thin lens modules, the imaging requirements of the lens modules may be higher, the area of the photosensitive chip may be increased correspondingly, and the functional components may be also increased correspondingly, so it may result in increasingly large sizes of the lens modules, which may be difficult to meet the requirements of miniaturization and ultra-thin thickness of the lens modules.

In addition, the photosensitive chip may be positioned inside a holder of the lens module and the peripheral chip may be positioned outside the holder, so there may be a certain distance between the photosensitive chip and the peripheral chip, which may reduce the rate of signal transmission. However, the peripheral chip may usually include a digital signal processor (DSP) chip and a memory chip, so it may be easy to adversely affect the image capturing speed and the storage speed, which may degrade the operational performance of the lens modules.

The present disclosure provides a method including: integrating photosensitive chips and functional components into an encapsulation layer, where, compared with the method of mounting the peripheral chip on the peripheral motherboard, the present disclosure may reduce a distance between the photosensitive chip and the functional component and correspondingly reduce a distance of an electrical connection between the photosensitive chip and the functional component, and further improve the rate of signal transmission and the operational performance of the lens modules (e.g., improve image capturing speed and storage speed); and omitting the circuit boards through the encapsulation layer, which may reduce the total thickness of the lens modules and meet the requirements of miniaturization and ultra-thin thickness of the lens modules.

In order to make the present disclosure easy to understand, detailed steps and corresponding structures will be provided to explain the technical solutions of the present disclosure. In the following, various preferred embodiments of the present disclosure are described in detail. However, it should be noted that in addition to the embodiments described herein, the present disclosure may be implemented in other forms.

FIGS. 1-9 illustrate structural schematics corresponding to structures at certain stages of an exemplary packaging method for image capturing assembly according to various disclosed embodiments of the present disclosure.

Referring to FIG. 1, a photosensitive chip 200 may be provided.

The photosensitive chip 200 may be an image sensor chip. In one embodiment, the photosensitive chip 200 may be a complimentary metal-oxide-semiconductor (CMOS) image sensor (CIS) chip. In other embodiments, the photosensitive chip may also be a charge coupled device (CCD) image sensor chip.

Specifically, the photosensitive chip 200 may include a photosensitive region 200C and a peripheral region 200E surrounding the photosensitive region 200C. Optical signal receiving surfaces 201 of the photosensitive chip 200 may at the photosensitive region 200C. The photosensitive chip 200 may receive and sense light radiation signals through the optical signal receiving surfaces 201.

The photosensitive chip 200 may include a plurality of pixel units, so the photosensitive chip 200 may include a plurality of semiconductor photosensitive devices (not shown) and a plurality of optical filter films (not shown) on the semiconductor photosensitive devices. The optical filter films may be used to selectively absorb and pass light signals received by the optical signal receiving surfaces 201.

The photosensitive chip 200 may further include micro-lenses 210 on the optical filter films. The micro-lenses 210 may be in one-to-one correspondence with the semiconductor photosensitive devices, so the received rays from light radiation signals may be focused to the semiconductor photosensitive devices. The optical signal receiving surfaces 201 may be upper surfaces of the corresponding micro-lenses 210.

It should be noted that, the photosensitive chip 200 may often be a silicon-based chip, which may be fabricated by an integrated circuit fabrication technology. The photosensitive chip 200 may have soldering pads which may be used for electrical connections between the photosensitive chip 200 and other chips or components. In one embodiment, the photosensitive chip 200 may have the first chip soldering pads 220 formed in the peripheral region 200E, In one embodiment, a surface of the photosensitive chip 200 which is on the same side of the optical signal receiving surfaces 201 may expose the first chip soldering pads 220. In other embodiments, a surface of the photosensitive chip facing away from the optical signal receiving surfaces may expose the first chip soldering pads.

Figure 2:
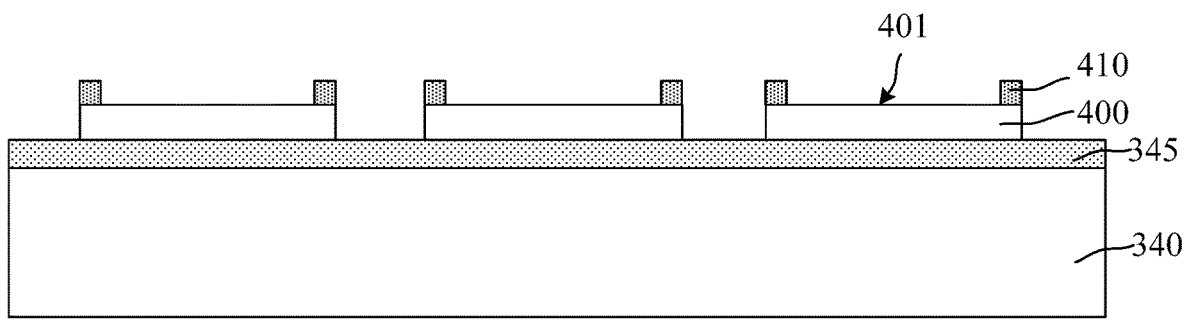
Figure 3:
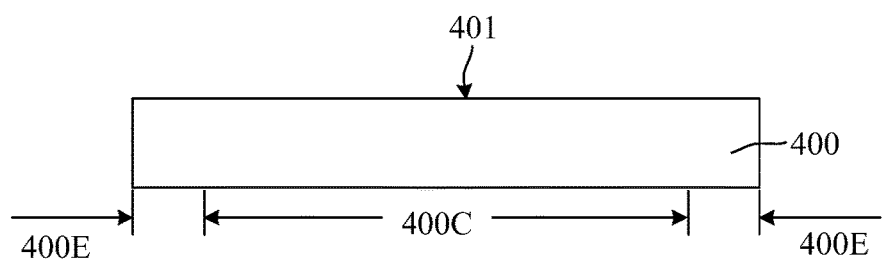
Figure 4:
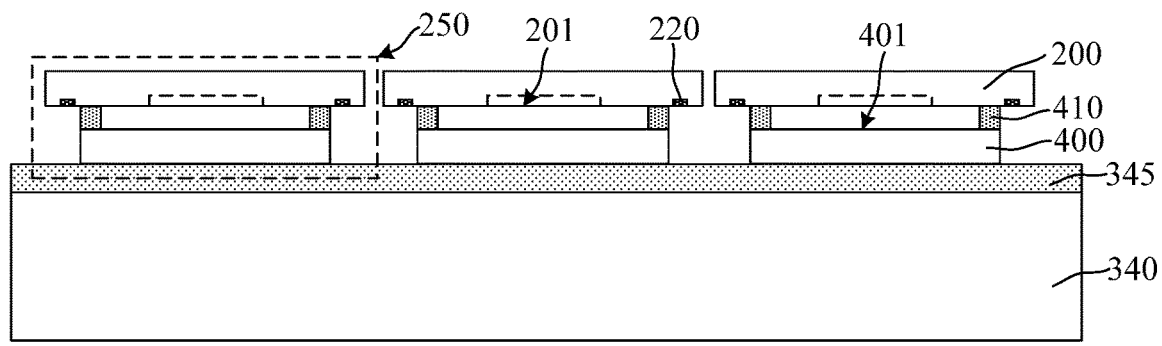

Referring to FIG. 2 to FIG. 4, FIG. 3 is an enlarged view of an optical filter in FIG. 2. The optical filter 400 (shown in FIG. 4) may be mounted on the photosensitive chip 200 (shown in FIG. 4) to form a photosensitive unit 250 (shown in FIG. 4).

The photosensitive chip 200 may have the optical signal receiving surfaces 201 (shown in FIG. 4) facing the optical filter 400. The optical filter 400 may be mounted first on the photosensitive chip 200 to prevent the subsequent encapsulation process from polluting the optical signal receiving surfaces 201 and also prevent the subsequent encapsulation process from adversely affecting the performance of the photosensitive chip 200. In addition, the mounting approach may be advantageous to significantly reduce the total thickness of the lens module and meet the requirements of miniaturization and ultra-thin thickness of the lens modules.

In order to achieve normal functions of the lens module, the optical filter 400 may be an infrared optical filter glass or a fully transparent glass. In one embodiment, the optical filter 400 may be an infrared optical filter glass and may be used to eliminate of the influence of infrared light in the incident ray on the performance of the photosensitive chip 200, which may be advantageous to improve the imaging effect.

For example, the optical filter 400 may be an infrared cut optical filter (IRCF) and the infrared cut optical filter may be a blue glass infrared cut optical filter or may include a glass and an IR cut coating on a surface of the glass.

In one embodiment, the optical filter 400 may include a surface to-be-bonded 401. The surface to-be-bonded 401 may be a surface used for mounting with the photosensitive chip 200, that is, a surface facing the photosensitive chip 200.

Specifically, when the optical filter 400 is the blue glass infrared cut optical filter, a surface of the blue glass infrared cut optical filter may be coated with an anti-reflective or anti-reflection coating and a surface facing away from the surface of the anti-reflective or anti-reflection coating may be the surface to-be-bonded 401; and when the optical filter 400 may include a glass and a IR cut coating on a surface of the glass, a glass surface facing away from the IR cut coating may be the surface to-be-bonded 401. In other embodiments, when the optical filter is the fully transparent glass, any surface of the fully transparent glass may be the surface to-be-bonded.

As shown in FIG. 3, the optical filter 400 may include a light transmitting region 400C and an edge region 400E surrounding the light transmitting region 400C. After forming the lens module, the light transmitting region 400C may be used to transmit external incident ray, so the optical signal receiving surfaces 201 of the photosensitive chip 200 may receive light signals. The edge region 400E may reserve a position space for mounting the optical filter 400 and the photosensitive chip 200.

As shown in FIG. 4, in one embodiment, the optical filter 400 may be mounted on the photosensitive chip 200 through a bonding structure 410 and the bonding structure 410 may surround the optical signal receiving surfaces 201 of the photosensitive chip 200.

The bonding structure 410 may be used for a physical connection between the optical filter 400 and the photosensitive chip 200. The optical filter 400, the bonding structure 410 and the photosensitive chip 200 may form a cavity (not labeledprof), which may avoid a direct contact between the optical filter 400 and the photosensitive chip 200 and may prevent the adverse effect on the performance of the photosensitive chip 200.

In one embodiment, the bonding structure 410 may surround the optical signal receiving surfaces 201, which may place the optical filter 400 above the optical signal receiving surfaces 201 on the photosensitive path of the photosensitive chip 200 and may ensure the optical performance of the photosensitive chip 200.

In one embodiment, the bonding structure 410 may be made of a photolithographic material and may be formed by a photolithographic process, which may not only improve the topography quality and dimensional accuracy of the bonding structure 410, packaging efficiency and production capacity, may also reduce the influence on the adhesive strength of the bonding structure 410.

In one embodiment, the bonding structure 410 may be made of a photolithographic dry film. In other embodiments, the bonding structure 410 may be made of a material including a photolithographic polyimide, a photolithographic polybenzoxazole (PBO) or a photolithographic benzocyclobutene (BCB).

It should be noted that, the bonding structure 410 may be formed on the photosensitive chip 200 or may be formed on the optical filter 400. In one embodiment, in order to reduce the process difficulty and simplify the process steps for forming the bonding structure 410 and also reduce the influence of forming process of the bonding structure 410 on the optical signal receiving surfaces 201, the bonding structure 410 may be formed on the optical filter 400.

Forming a photosensitive unit 250 may include: with continued reference to FIG. 2, providing a first carrier substrate 340; temporarily bonding a surface of the optical filter 400 facing away from the surface to-be-bonded 401 on the first carrier substrate 340.

The first carrier substrate 340 may be used to provide a process platform for the mounting of the optical filter 400 and the photosensitive chip 200. In one embodiment, the first carrier substrate 340 may be a carrier wafer. In other embodiments, the third carrier substrate may be other types of substrates.

Specifically, the optical filter 400 may be temporarily bonded on the first carrier substrate 340 through a first temporary bonding layer 345. The first temporary bonding layer 345 may be used as a peeling layer, which may be convenient to implement a debonding subsequently.

In one embodiment, the first temporary bonding layer 345 may be a foaming film. The foaming film may include a micro-adhesive surface and a corresponding foaming surface. The foaming film may be viscous at room temperature and the foaming surface may be attached to the first carrier substrate 340. By subsequently heating the foaming film, the foaming film may lose its viscosity and implement the debonding.

In other embodiments, the first temporary bonding layer may also be a die attach film (DAF).

With continued reference to FIG. 2, after bonding the optical filter 400 on the first carrier substrate 340 temporarily, the annular bonding structure 410 may be formed at the edge region 400E (shown in FIG. 3) of the optical filter 400.

For example, forming the bonding structure 410 may include: forming an adhesive material layer (not shown) covering the optical filter 400 and the first temporary bonding layer 345; and patterning the adhesive material layer by the photolithographic process, where the remaining adhesive material layer, which is retained at the edge region 400E, may be used as the bonding structure 410.

With continued reference to FIG. 4, the optical signal receiving surfaces 201 of the photosensitive chip 200 may face toward the annular bonding structure 410, and the peripheral region 200E (shown in FIG. 1) of the photosensitive chip 200 may be mounted on the annular bonding structure 410 to form the photosensitive unit 250.

In one embodiment, after forming the photosensitive unit 250, the first chip soldering pads 220 may face toward the optical filter 400.

Figure 5:
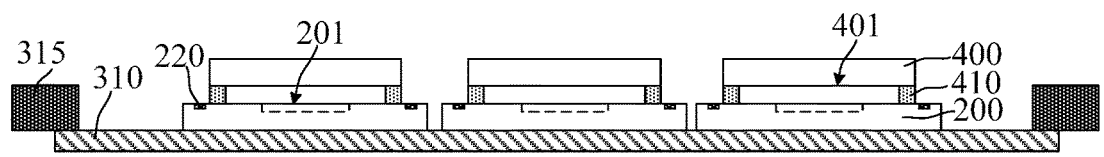

Referring to FIG. 5, it should be noted that, after forming the photosensitive unit 250 (shown in FIG. 4), the method may further include: attaching a surface of the photosensitive chip 200 facing away from the optical signal receiving surfaces 201 to an ultra-violet (UV) film 310, and after the attaching step, removing the first carrier substrate 340 (shown in FIG. 4) by a first debonding treatment.

The process for the subsequent temporary bonding may be prepared using the attaching step, and the UV film 310 may provide support and fixation to the photosensitive unit 250 after removing the first carrier substrate 340. The adhesion of the UV film 310 under UV light may be weaken and the photosensitive unit 250 may be easily removed from the UV film subsequently.

For example. the UV film 310 may be attached firmly to the surface of the photosensitive chip 200 facing away from the optical signal receiving surfaces 201 by a lamination machine and may also be attached to a bottom of a frame 315 having a relatively large diameter. The frame 315 may be used to stretch the film, so the photosensitive unit 250 may be discretely fixed on the UV film. The detailed description of the UV film 310 and the frame 315 may not be described in detail herein.

In one embodiment, the first temporary bonding layer 345 (shown in FIG. 4) may be the foaming film, so a thermal debonding process may be used for the first debonding treatment. For example, a thermal treatment may be performed on the first temporary layer 345, which may make the foaming surface of the foaming film to lose viscosity, so the first carrier substrate 340 may be removed and the first temporary bonding layer 345 may be removed subsequently by tearing after removing the first carrier substrate 340.

The disclosed image capturing assembly may further include functional components. The functional components may be any suitable functional components other than the photosensitive chip in the imaging capturing assembly (e.g., a camera assembly). For example, the functional components may be functional components 290 as shown in FIG. 6.

Figure 6:
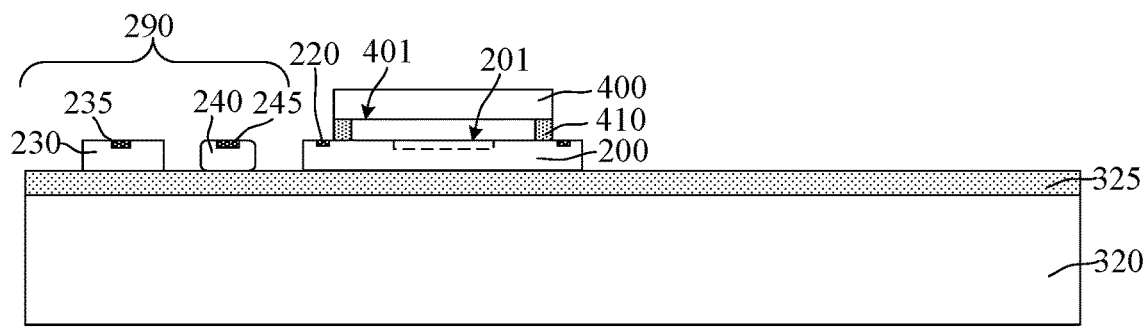

Referring to FIG. 6, a second carrier substrate 320 may be provided. The photosensitive chip 200 and functional components 290 may be temporarily bonded on the second carrier substrate 320. The functional components 290 may include one or more of a peripheral chip 230 and a passive component 240. Of course, more functional components may be added.

A temporary bonding (TB) may prepare the process for the subsequent packaging integration and electrical integration of each chip and functional components. In addition, the photosensitive chip 200 and the functional components may be conveniently separated from the second carrier substrate 320 subsequently through the temporary bonding.

The second carrier substrate 320 may be used to provide a process platform for forming a subsequent encapsulation layer.

In one embodiment, the second carrier substrate 320 may be a carrier wafer. In other embodiments, the second carrier substrate may be other types of substrates.

Specifically, the photosensitive chip 200 and the functional components may be temporarily bonded on the second carrier substrate 320 through a second temporary bonding layer 325. In one embodiment, the second temporary bonding layer 325 may be a foaming film. The detailed description of the second temporary bonding layer 325 may refer to the corresponding above-mentioned description of the first temporary bonding layer 345 (shown in FIG. 4), and details may not be described herein.

Referring to FIG. 6, the surface of the photosensitive chip 200 facing away from the optical filter 400 may temporarily bonded on the second carrier substrate 320.

Specifically, the UV film 310 (shown in FIG. 5) at the position of a single photosensitive unit 250 may be irradiated with UV light. The UV film 310 irradiated with UV light may lose its viscosity and the single photosensitive unit 250 may be lifted by a thimble. Then the photosensitive unit 250 may be lifted by a suction device, the photosensitive unit 250 may be peeled off from the UV film 310 and may be placed on the second carrier substrate 320 sequentially. The positional precision of the photosensitive unit 250 on the second carrier substrate 320 may be improved by temporarily bonding the photosensitive unit 250 on the second carrier substrate 320 one by one, which may be convenient to the normal operation of the subsequent process.

In one embodiment, after temporarily bonding the photosensitive chip 200 on the second carrier substrate 320, the first chip soldering pads 220 of the photosensitive chip 200 may face away from the second carrier substrate 320.

It should be noted that, in one embodiment, after forming the photosensitive unit 250 (shown in FIG. 4), the photosensitive chip 200 may be temporarily bonded on the second carrier substrate 320. In other embodiments, after the photosensitive chip is temporarily bonded on the second carrier substrate, the optical filter may be mounted on the photosensitive chip.

For illustrative purposes, although only one photosensitive unit 250 is shown in FIG. 6, any number of photosensitive units may be included in the disclosed image capturing assembly according to various embodiments of the present disclosure. For example, a plurality of photosensitive units 250 may be included in a lens module, when the lens module is applied to a dual-camera or array module product.

Still in FIG. 6, the functional components may be temporarily bonded on the second carrier substrate 320.

In one embodiment, the functional components may include the peripheral chip 230 and the passive component 240.

The peripheral chip 230 may be an active component. After being electrically connected to the photosensitive chip 200 subsequently, the peripheral chip 230 may be used to provide the photosensitive chip 200 with a peripheral circuit such as an analog power supply circuit, a digital power supply circuit, a voltage buffer circuit, a shutter circuit, a shutter drive circuit, etc.

In one embodiment, the peripheral chip 230 may include one or two of a digital signal processor chip and a memory chip. In other embodiments, the peripheral chip may also include chips with other functional types. For convenience of illustration, only one peripheral chip 230 may be shown in FIG. 6, but the number of the peripheral chips 230 may be not limited to one.

The peripheral chip 230 may usually be a silicon-based chip, which may be fabricated using an integrated circuit fabrication technology and may also have a soldering pad for the electrical connection between the peripheral chip 230 and other chips or components. In one embodiment, the peripheral chip 230 may include a second chip soldering pad 235.

In one embodiment, the first chip soldering pads 220 may face away from the second carrier substrate 320. In order to reduce the difficulty of the subsequent process of the electrical connection, after temporarily bonding the peripheral chip 230 on the second carrier substrate 320, the second chip soldering pad 235 may also face away from the second carrier substrate 320, so the first chip soldering pads 220 and the second chip soldering pad 235 may be on the same side.

It should be noted that, the first peripheral chip 230 and the photosensitive chip 200 may be both integrated in the subsequently formed encapsulation layer. In order to improve the surface flatness of the encapsulation layer and reduce the process difficulty of forming the encapsulation layer, the thicknesses of the peripheral chip 230 and the photosensitive chip 200 may be same, or the thickness difference between the peripheral chip 230 and the photosensitive chip 200 may be relatively small. The matching thickness of the peripheral chip 230 may be formed according to the thickness of the photosensitive chip 200. In one embodiment, the thickness difference between the peripheral chip 230 and the photosensitive chip 200 may be in a range from about −2 μm to about 2 μm.

The passive component 240 may be used to play a specific role in the photosensitive operation of the photosensitive chip 200. The passive component 240 may include smaller electronic components such as resistors, capacitors, inductors, diodes, triodes, potentiometers, relays or drivers. For convenience of illustration, only one passive component 240 may be shown in FIG. 6, but the number of the passive component 240 may be not limited to one.

The passive component 240 may have a soldering pad for an electrical connection between the passive component 240 and other chips or components. In one embodiment, a soldering pad of the passive component 240 may be an electrode 245.

It can be seen form the above-mentioned analysis that, when the first chip soldering pads 220 faces away from the second carrier substrate 320, in order to reduce the process difficulty of the subsequent electrical connection, the electrode 245 may also face away from the second carrier substrate 320 after temporarily bonding the passive component 240 on the second carrier substrate 320.

It can be seen form the above-mentioned analysis that, in order to improve the surface flatness of the encapsulation layer and reduce the process difficulty of forming the encapsulation layer, the matching thickness of the passive component 240 may be formed according to the thickness of the photosensitive chip 200. In one embodiment, the thickness difference between the passive component 240 and the photosensitive chip 200 may be in a range from about −2 μm to about 2 μm.

It should be noted that, in other embodiments, after temporarily bonding the photosensitive chip and the functional components on the second carrier substrate, the soldering pads of the photosensitive chip may face away from the second carrier substrate and the soldering pad of the passive component may face away from the second carrier substrate, or the soldering pads of the photosensitive chip and the functional components may all face toward the second carrier substrate.

Figure 7:
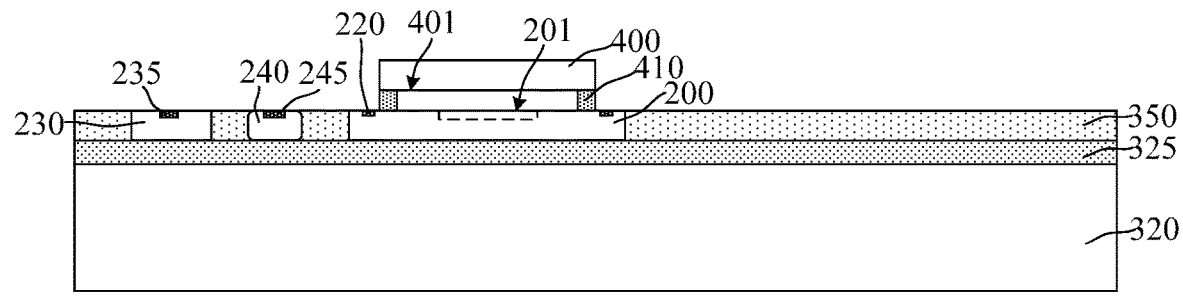

Referring to FIG. 7, after forming an encapsulation layer 350 on the second carrier substrate 320, the encapsulation layer 350 may at least be filled between the photosensitive chip 200 and the functional components.

The encapsulation layer 350 may provide fixation to the photosensitive chip 200 and the functional components (e.g., the peripheral chip 230 and the passive component 240), which may be used to implement the packaging integration of the photosensitive chip 200 and the functional components.

The encapsulation layer 350 may not only reduce the space occupied by the holder of the lens assembly and also omit the circuit board (e.g., printed circuit board (PCB)), which may significantly reduce the total thickness of the formed lens module and meet the requirements of the miniaturization and ultra-thin thickness of the lens module. Compared with the method of mounting the functional components on the peripheral motherboard, integrating all the photosensitive chip and the functional components into the encapsulation layer 350 may reduce a distance between a photosensitive chip 200 and each functional component, and correspondingly reduce a distance of the electrical connection between the photosensitive chip and each functional component, which may improve the rate of signal transmission and the operational performance of the lens module (e.g., improve image capturing speed and storage speed).

In one embodiment, the encapsulation layer 350 may also function as insulation, sealing and moisture proof, which may be advantageous to improve the reliability of the formed lens module.

In one embodiment, the encapsulation layer 350 may be made of epoxy resin. Epoxy resin has advantage of low shrinkage, good adhesion, good corrosion resistance, excellent electrical properties and low cost, and is widely used a packaging material for electronic devices and integrated circuits.

In one embodiment, in order to facilitate the process of the subsequent electrical connection, the encapsulation layer 350 may expose the soldering pads of the photosensitive chip 200 and the functional components. For example, the encapsulation layer 350 may expose the first chip soldering pads 220, the second chip soldering pad 235 and the electrode 245.

In one embodiment, the electrical connection may be subsequently implemented by a wire bonding process. In such way, the first chip soldering pads 220, the second chip 235 and the electrode 245 may all face away from the second carrier substrate 320. In order to reduce the complexity of the subsequent wire bonding process, after forming the encapsulation layer 350, the encapsulation layer 350 may be filled between the photosensitive chip 200 and the functional components.

In other embodiments, according to the actual electrical connection process, the encapsulation layer may cover the second carrier substrate, the functional components and the photosensitive chip, and also expose the optical filter.

In one embodiment, the encapsulation layer 350 may be formed by an injection molding process. The injection molding process may have the features of high production speed, high efficiency, automation of operation. By selecting the injection molding process, it is advantageous to improve production and lower process cost. In addition, by selecting the injection molding process, a matching mold may be prepared, where the thickness and the formed area of the encapsulation layer 350 may meet the process requirements, and the process may be simple.

It should be noted that, even if there is a thickness difference between the photosensitive chip 200 and the functional components, the surface of the encapsulation layer 350 may be stepped by preparing a matching mold, which may ensure the encapsulation layer 350 may expose all soldering pads of the photosensitive chip 200 and the functional components.

In one embodiment, the thickness difference between the photosensitive chip 200 and the functional components may be relatively small, which may reduce the process difficulty of forming the encapsulation layer 350 accordingly.

For example, form the encapsulation layer 350 may include: after temporarily bonding the photosensitive chip 200 and the functional components on the second carrier substrate 320 and completing the mounting the photosensitive chip 200 and the optical filter 400 on the second carrier substrate 320, positioning the second carrier substrate 320 into a mold, where the mold may include an upper mold and a lower mold, and any one of the upper mold and the lower mold may have a trench; positioning the second carrier substrate 320 between the upper mold and the lower mold; after a clamping, pressing the mold onto the photosensitive chip 200, the peripheral chip 230, the passive component 240 and the second carrier substrate 320, positioning the optical filter 400 into the trench, and forming a cavity between the upper mold and the lower mold; injecting a molding material into the cavity to form the encapsulation layer 350; and after forming the encapsulation layer 350, a demolding treatment may be performed to separate the encapsulation layer 350 and the mold.

During the injection molding process, the optical filter 400 may be positioned in the trench, so the encapsulation layer 350 may not cover the optical filter 400. In addition, after the clamping, the mold may be pressed onto the photosensitive chip 200, the peripheral chip 230 and the passive component 240, so the encapsulation layer 350 may be only filled between the photosensitive chip 200, the peripheral chip 230 and the passive component 240, where the process may be simple.

In other embodiments, the encapsulation layer may be formed by other molding processes according to the actual situation. For example, after forming a certain thickness of the encapsulation layer, an etching process or a grinding process may be performed on the encapsulation layer to remove a portion thickness of the encapsulation layer, so the remaining encapsulation layer may expose all soldering pads of the photosensitive chip and the functional components.

It should be noted that, the circuit board may be omitted, so the thickness of the lens module may be reduced. In such way, in one embodiment, the photosensitive chip 200 and the peripheral chip 230 may not need to be thinned, which may improve the mechanical strength and reliability of the photosensitive chip 200 and the peripheral chip 230 and may further improve the reliability of the lens module. In other embodiments, the thickness of the photosensitive chip and the peripheral chip may be appropriately reduced according to the process requirements, but the thinning amount may be relatively small to ensure that the mechanical strength and reliability may not be affected.

In addition, in one embodiment, the encapsulation layer 350 may be formed after bonding the photosensitive chip 200 on the second carrier substrate 320. Compared with the method of forming an opening in the encapsulation layer and positioning the photosensitive chip into the corresponding opening, in one embodiment, the alignment error may be avoided, and the process complexity of the system integration may be reduced.

Figure 8:
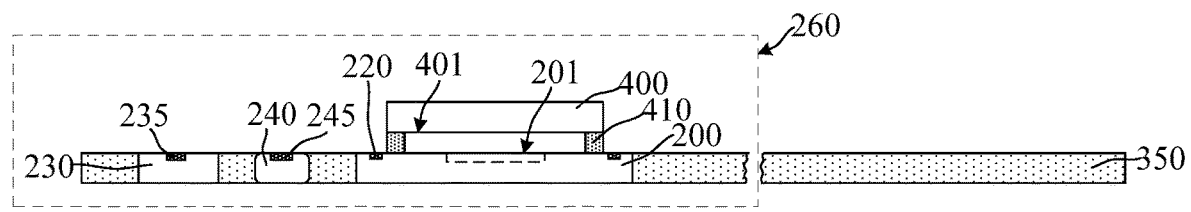

Referring to FIG. 8, the encapsulation method may further include: after forming the encapsulation layer 350, performing a second debonding treatment to remove the second carrier substrate 320 (shown in FIG. 7).

The second carrier substrate 320 may be used to provide a process platform for forming the encapsulation layer 350, so the second carrier substrate 320 may be removed after forming the encapsulation layer 350.

In one embodiment, the second debonding treatment may be performed using a thermal bonding process. The second carrier substrate 320 and the second temporary bonding layer 325 (shown in FIG. 7) may be removed sequentially. A detailed description of the second debonding treatment may refer to the corresponding above-mentioned description of the first debonding treatment, and details may not be described herein.

With continued reference to FIG. 8, after the second debonding treatment, the method may further include: performing a dicing treatment on the encapsulation layer 350.

A single image capturing assembly 260 matching the process requirement may be formed by the dicing treatment, which may prepare the process for the assembly of subsequent lens assembly. In one embodiment, the dicing treatment may be performed by a laser cutting process.

It should be noted that, in one embodiment, the second debonding treatment may be performed first and then the dicing treatment may be performed. In other embodiments, the second debonding treatment may be performed after the dicing treatment. Correspondingly, the second carrier substrate may further provide a process platform for the dicing treatment.

Figure 9:
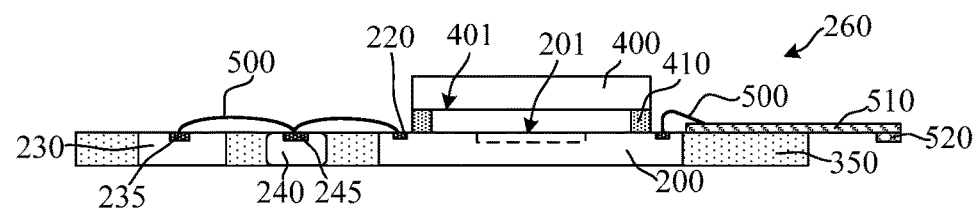

Referring to FIG. 9, after the dicing treatment, the method may further include: forming a lead wire 500 electrically connecting the soldering pads of the photosensitive chip 200 and the functional components using a wire bonding process.

The lead wire 500 may be used to implement electrical integration of the image capturing assembly 260.

In one embodiment, the wire bonding process may be used to implement the electrical connection between the photosensitive chip 200 and the functional components. The wire bonding process may be the most commonly used circuit connection method in the integrated circuit packaging process, where a thin metal wire or a thin metal strip may be sequentially placed on bonding sites of a chip and a pin or an encapsulation substrate to form a circuit connection. The wire bonding process may have a relatively high compatibility with the current encapsulation process, low cost and relatively less modification by selecting the wire bonding process.

In one embodiment, the lead wire 500 may be a metal wire such as a gold wire or an aluminum wire. For example, the lead wire 500 may electrically connect to the first chip soldering pads 220, the second chip soldering pad 235 and the electrode 245.

In other embodiments, before performing the second debonding treatment, the wire bonding process may be performed, so the second carrier substrate may be used to provide a process platform for the wire bonding process.

In should be noted that the first chip soldering pads 220, the second chip soldering pad 235 and the electrode 245 may be located on the same side of the encapsulation layer 350 and all face toward the optical filter 400, so the wire bonding process may be performed on a side of the encapsulation layer 350 adjacent to the optical filter 400.

Correspondingly, when the lens assembly is subsequently assembled on the encapsulation layer 350 to obtain a lens module, the lead wire 500 may be located in a holder of the lens assembly, so the lead wire 500 may be protected, which may be advantageous to improve the reliability of the lens module and be convenient to assembly the lens module in electronic devices.

With continued reference to FIG. 9, it should be noted that, after the dicing treatment on the encapsulation layer 350 and before the wire bonding process, the method may further include: mounting a flexible printed circuit (FPC) board 510 on the encapsulation layer 350.

The FPC board 510 may be used to implement the electrical connection between the image capturing assembly 260 and the subsequent lens assembly, and also the electrical connection between the formed lens module and other components without using a circuit board. In addition, after forming the subsequent lens module, the lens module may be also electrically connected to other components in the electronic device through the FPC board 510, which may implement normal image capturing functions of the electronic devices.

In one embodiment, the FPC board 510 may be mounted on the encapsulation layer 350 on a side of the optical filter 400. In the wire bonding process, the lead wire 500 may be used to electrically connect the photosensitive chip 200 with the FPC board 510, so the lead wire 500 may be used to implement the electrical connection between the photosensitive chip 200, the functional components and the FPC board 510. For example, the lead wire 500 may electrically connect the first chip soldering pads 220 of the photosensitive chip 200 with the FPC board 510.

It should be noted that, a connector 520 may be formed on the FPC board 510 for electrically connecting the FPC board 510 with other circuit components. When the lens module is applied to an electronic device, the connector 520 may be electrically connected with the mother board of the electronic device, so the information transmission between the lens module and other components in the electronic device may be achieved and image information of the lens module may be transmitted to the electronic device. For example, the connector 520 may be a gold finger connector.

It should be noted that, in one embodiment, the wire bonding process may be performed after mounting the FPC board 510 on the encapsulation layer 350, so the electrical connection between the photosensitive chip 200, the functional components and the FPC board 510 may be implemented in the same electrical connection step. In other embodiments, the FPC board may be mounted after implementing the electrical connection between the photosensitive chip and the functional components, another wire bonding process may be required to electrically connect the FPC board with the photosensitive chip.

Figure 10:
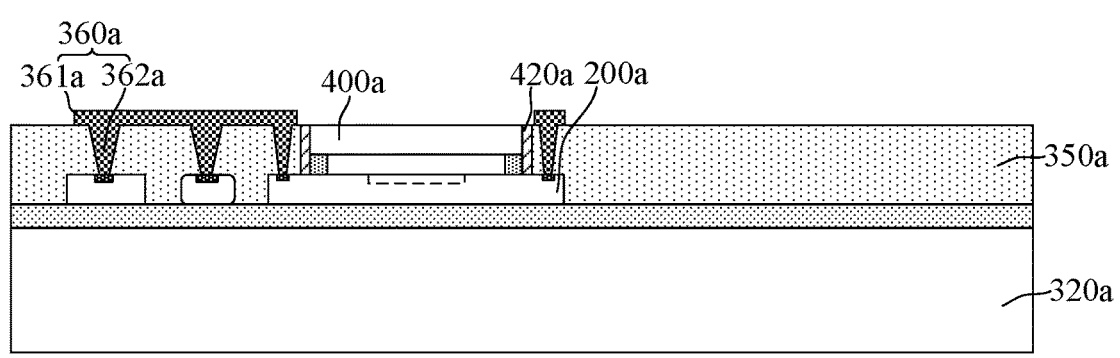
FIGS. 10-11 illustrate structural schematics corresponding to structures at certain stages of another exemplary packaging method for image capturing assembly according to various disclosed embodiments of the present disclosure.
Figure 11:
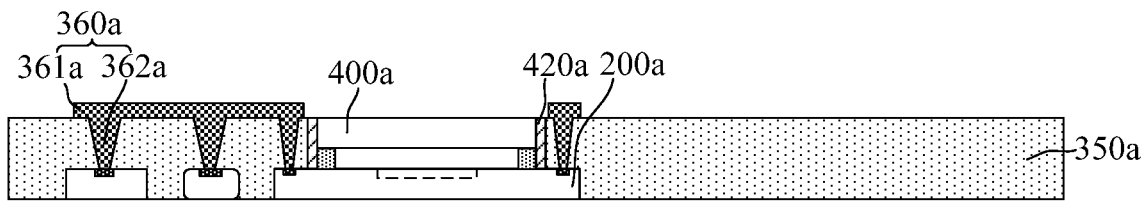

FIGS. 10-11 illustrate structural schematics corresponding to certain stages of another exemplary packaging method for image capturing assembly according to various disclosed embodiments of the present disclosure.

The similarity between one embodiment and the previous embodiments may be not described herein. The difference between one embodiment and the previous embodiments is: after forming an encapsulation layer 350a, the encapsulation layer 350a may cover a carrier substrate 320a, a photosensitive chip 200a and functional components (not labeled) and may expose an optical filter 400a.

In one embodiment, the encapsulation layer 350a may cover the photosensitive chip 200a and the functional components, which may reduce the influence of the thickness difference between the photosensitive chip 200a and the functional components on the formation process of the encapsulation layer 350a.

For example, referring to FIG. 10, the photosensitive chip 200a and the functional components (not labeled) may be temporarily bonded on the carrier substrate 320a, and the soldering pads of the photosensitive chip 200a and the functional components may all face away from the carrier substrate 320a.

With continued reference to FIG. 10, the encapsulation layer 350a may be formed. The encapsulation layer 350a may cover the carrier substrate 320a, the photosensitive chip 200a and the functional components (not labeled) and may also cover sidewalls of the optical filter 400a.

After the photosensitive chip 200a and the optical filter 400a are mounted, a photosensitive unit may be formed. The encapsulation layer 350a may cover the sidewalls of the optical filter 400a, so the sealing property of the cavity in the photosensitive unit may be improved, the probability of water vapor, oxidizing gas, etc. entering the cavity may be reduced, and the performance of the photosensitive chip 200a may be ensured.

Correspondingly, in order to reduce the stress generated by the encapsulation layer 350a on the optical filter 400a, before forming the encapsulation layer 350a, the method may further include: forming a stress buffer layer 420a on the sidewalls of the optical filter 400a.

In one embodiment, the material of the stress buffer layer 420a may be an epoxy adhesive. The epoxy adhesive may be an epoxy resin adhesive and may have a variety of forms. By changing its composition, materials with different elastic modulus may be obtained, so the stress on the optical filter 400a may be regulated according to actual situations.

With continued reference to FIG. 10, a redistribution layer (RDL) structure 360a may be formed on a side of the encapsulation layer 350a adjacent to the optical filter 400a, which may electrically connect the soldering pads of the photosensitive chip 200a with the pads of the functional components (not labeled).

In one embodiment, the encapsulation layer 350a may cover the photosensitive chip 200a and the functional components, so the redistribution layer structure 360a may include: conductive columns 362a, which may be located in the encapsulation layer 350a and may electrically connect the soldering pads of the photosensitive chip 200a with the soldering pads of the functional components (not labeled); and interconnect lines 361a, which may be located on the encapsulation layer 350a and may be connected to the conductive columns 362a.

Referring to FIG. 11, after forming the redistribution layer structure 360a, a debonding treatment may be performed to remove the carrier substrate 320a.

A detailed description of the packaging method may refer to the corresponding description of the previous embodiments, and details may not be described herein.

Figure 12:
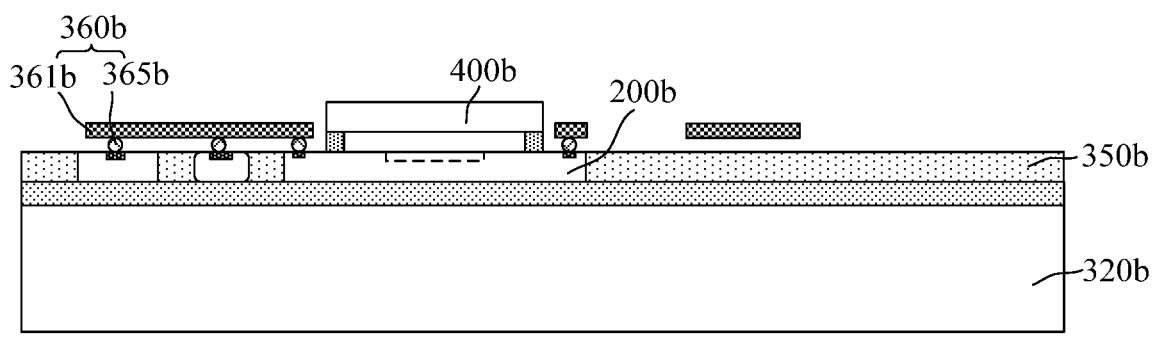
FIGS. 12-13 illustrate structural schematics corresponding to structures at certain stages of another exemplary packaging method for image capturing assembly according to various disclosed embodiments of the present disclosure.
Figure 13:
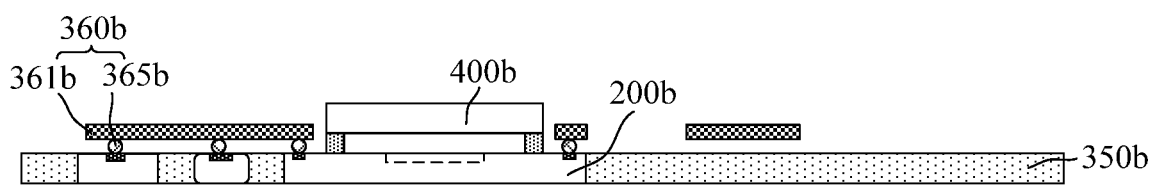

FIGS. 12-13 illustrate structural schematics corresponding to certain stages of another exemplary packaging method for image capturing assembly according to various disclosed embodiments of the present disclosure.

The similarity between one embodiment and the previous embodiments may be not described herein. The difference between one embodiment and the previous embodiments is: using a redistribution layer structure 360b to electrically connect the photosensitive chip 200b with functional components (not labeled).

Referring to FIG. 12, after temporarily bonding a photosensitive chip 200b and the functional components on a carrier substrate 320b, soldering pads of the photosensitive chip 200b and soldering pads of the functional components may all face away from the carrier substrate 320b. After forming an encapsulation layer 350b on the carrier substrate 320b, the encapsulation layer 350b may be filled between the photosensitive chip 200b and the functional components.

With continued reference to FIG. 12, the redistribution layer structure 360b may be formed on a side of the encapsulation layer 350b adjacent to the optical filter 400b.

In one embodiment, forming the redistribution layer structure 360b may include: respectively forming conductive bumps 365b on the soldering pads of the photosensitive chip 200b and the soldering pads of the functional components; and bonding the interconnect lines 361b on the conductive bumps 365b, where the interconnect lines 361b and the conductive bumps 365b may constitute the redistribution layer structure 360b.

The conductive bumps 365b may protrude from the surfaces of the photosensitive chip 200b and the functional components, which may be advantageous to improve the reliability of the electrical connection between each soldering pad and the interconnect lines 361b.

In one embodiment, a soldering ball process may be used to form the conductive bumps 365b.

Referring to FIG. 13, after forming the redistribution layer structure 360b, a debonding treatment may be performed to remove the carrier substrate 320b (shown in FIG. 12).

A detailed description of the packaging method may refer to the corresponding description of the previous embodiments, and details may not be described herein.

Figure 14:
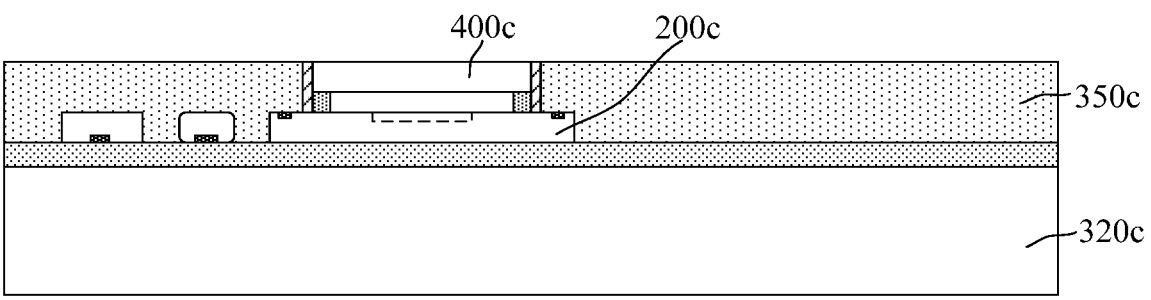
FIGS. 14-16 illustrate structural schematics corresponding to structures at certain stages of another exemplary packaging method for image capturing assembly according to various disclosed embodiments of the present disclosure.
Figure 15:
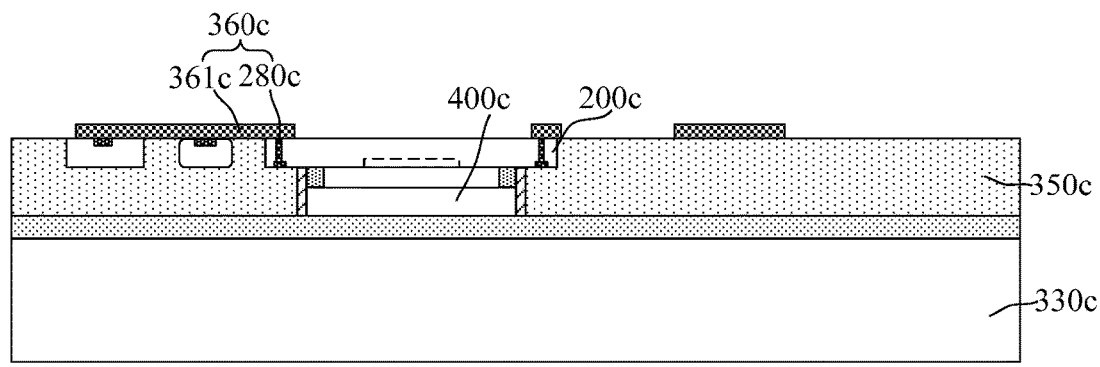
Figure 16:
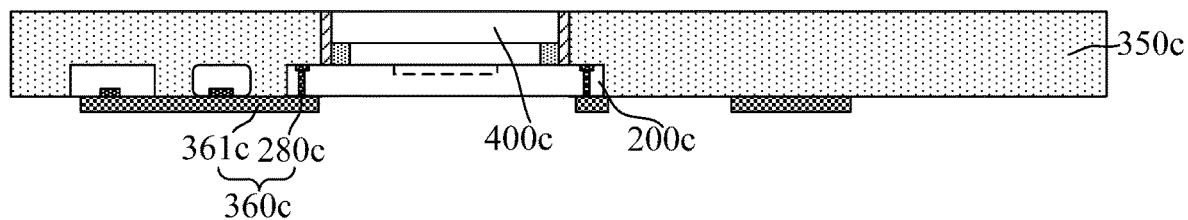

FIGS. 14-16 illustrate structural schematics corresponding to certain stages of another exemplary packaging method for image capturing assembly according to various disclosed embodiments of the present disclosure.

The similarity between one embodiment and the previous embodiments may be not described herein. The difference between one embodiment and the previous embodiments is: forming a redistribution layer structure 360c on a side of an encapsulation layer 350c facing away from an optical filter 400c.

For example, referring to FIG. 14, a photosensitive chip 200c and functional components (not labeled) may be temporarily bonded on a first carrier substrate 320c. Soldering pads of the photosensitive chip 200c may face away from the first carrier substrate 320c and soldering pads of the functional components may face toward the first carrier substrate 320c.

With continued reference to FIG. 14, the encapsulation layer 350c may be formed on the first carrier substrate 320c. The encapsulation layer 350c may cover the photosensitive chip 200c and the functional components (not labeled) and may also cover sidewalls of the optical filter 400c.

Referring to FIG. 15, after forming the encapsulation layer 350c, a debonding treatment may be performed to remove the first carrier substrate 320c. After removing the first carrier substrate 320c, a surface of the encapsulation layer 350c facing away from the photosensitive chip 200c may be bonded on a second carrier substrate 330c.

With continued reference to FIG. 15, after temporarily bonding the surface of the encapsulation layer 350c facing away from the photosensitive chip 200c on the second carrier substrate 330c, conductive columns 280c may be formed in the photosensitive chip 200c and may electrically connect the soldering pads of the photosensitive chip 200c. Interconnect lines 361c may be formed on the surface of the encapsulation layer 350c facing away from the second carrier substrate 330c. The interconnect lines 361c may electrically connect the soldering pads of the functional components (not labeled) with the conductive columns 280c. The interconnect lines 361c and the conductive columns 280c may constitute the redistribution layer structure 360c.

Referring to FIG. 16, after forming the redistribution layer structure 360c, the debonding treatment may be performed to remove the second carrier substrate 330c (shown in FIG. 15).

A detailed description of the packaging method may refer to the corresponding description of the previous embodiments, and details may not be described herein.

Correspondingly, the present disclosure may further provide an image capturing assembly. FIG. 9 illustrate a structural schematic corresponding to an exemplary image capturing assembly of the present disclosure.

The image capturing assembly 260 may include: the encapsulation layer 350; the photosensitive unit 250 (shown in FIG. 4) and the functional components (not labeled) which are embedded in the encapsulation layer 350; and the photosensitive unit 250. The photosensitive unit 250 may include the photosensitive chip 200 and the optical filter 400 mounted on the photosensitive chip 200. A bottom of the encapsulation layer 350 may at least expose the photosensitive chip 200 and the functional components.

The encapsulation layer 350 may be used to fix the photosensitive chip 200 and the functional components and may implement the packaging integration of the functional components and the photosensitive chip 200. The encapsulation layer 350 may not only reduce the space occupied by the holder of the lens assembly and also omit the circuit board, which may reduce the total thickness of the formed lens module and meet the requirements of the miniaturization and ultra-thin thickness of the lens module.

The material of the encapsulation layer 350 may be a molding material. The encapsulation layer 350 may also function as insulation, sealing and moisture proof, which may be advantageous to improve the reliability of the formed lens module. In one embodiment, the encapsulation layer 350 may be made of an epoxy resin.

In one embodiment, the encapsulation layer 350 may include opposing upper and bottom surfaces. The upper surface of the encapsulation layer 350 may be a surface for mounting the lens module and the bottom surface of the encapsulation layer 350 may be a surface away from the optical filter 400.

In one embodiment, in the packaging process of the image capturing assembly 260, after temporarily bonding the photosensitive chip 200 and the functional components on a carrier substrate, the encapsulation layer 350 may be formed on the carrier substrate, so the bottom of the encapsulation layer 350 may at least expose the photosensitive chip 200 and the functional components.

In one embodiment, both the upper surface and the bottom surface of the encapsulation layer 350 may expose the photosensitive chip 200 and the functional components. In other embodiments, according to actual electrical connections, the bottom surface of the encapsulation layer may expose the photosensitive chip and the functional components. The upper surface of the encapsulation layer may be higher than the photosensitive chip and the functional components and may expose the optical filter.

In one embodiment, the photosensitive chip 200 and the functional components may all have soldering pads for implementing the electrical connection between the photosensitive chip 200 and the functional components, and also for implementing the electrical connection between the photosensitive chip 200, the functional components and other components. In order to facilitate the electrical connection process, the encapsulation layer 350 may expose the soldering pads of the photosensitive chip 200 and the functional components.

In one embodiment, the photosensitive chip 200 may be a CMOS image sensor chip. In other embodiments, the photosensitive chip may also be a CCD image sensor chip.

Referring to FIG. 1, in one embodiment, the photosensitive chip 200 may include a photosensitive region 200C and a peripheral region 200E surrounding the photosensitive region 200C. The photosensitive chip 200 may also have the optical signal receiving surfaces 201 in the photosensitive region 200C.

The photosensitive chip 200 may be a silicon-based chip, which may be fabricated using the integrated circuit fabrication technology. The soldering pads of the photosensitive chip 200 may be used for the electrical connection between the photosensitive chip 200 and other chips or components. In one embodiment, the photosensitive chip 200 may have the first chip soldering pads 220 on the peripheral region 200E.

In one embodiment, the first chip soldering pads 200 may face toward the optical filter 400, that is, the first chip soldering pads 220 may face away from the bottom of the encapsulation layer 350. In other embodiments, the first chip soldering pads may face away from the optical filter.

It should be noted that, in one embodiment, only one photosensitive unit 250 may be illustrated. In other embodiments, the number of the photosensitive unit may be plural when the formed lens module may be applied to a dual-camera or array module product.

The optical filter 400 may be mounted on the photosensitive chip 200 and face toward the optical signal receiving surfaces 201. The optical filter 400 may prevent the encapsulation process from polluting the optical signal receiving surfaces 201 and may avoid adverse effect on the performance of the photosensitive chip 200, which may improve the imaging quality of the lens module. In addition, the mounting approach may significantly reduce the total thickness of the lens module and meet the requirements of miniaturization and ultra-thin thickness of the lens modules.

The optical filter 400 may be an infrared optical filter glass or a fully transparent glass. In one embodiment, the optical filter 400 may be an infrared optical filter glass and may be used to eliminate of the influence of infrared light in the incident light on the performance of the photosensitive chip 200, which may be advantageous to improve the imaging effect.

In one embodiment, the optical filter 400 may be mounted on the photosensitive chip 200 by the bonding structure 410, and the bonding structure 410 may surround the optical signal receiving surfaces 201 of the photosensitive chip 200. The bonding structure 410 may be used for a physical connection between the optical filter 400 and the photosensitive chip 200, and may avoid a direct contact between the optical filter 400 and the photosensitive chip 200, which may prevent the optical filter 400 from adversely affecting the performance of the photosensitive chip 200.

In one embodiment, the bonding structure 410 may surround the optical signal receiving surfaces 201, so the optical filter 400 above the optical signal receiving surfaces

201 may be located on the photosensitive path of the photosensitive chip 200, which may ensure the performance of the photosensitive chip 200.

The functional components may be specific functional components other than the photosensitive chip 200 in the imaging capturing assembly. The functional components may include at least one of the peripheral chip 230 and the passive component 240.

In one embodiment, the functional components may include the peripheral chip 230 and the passive component 240.

The peripheral chip 230 may be an active component and may be used to provide the photosensitive chip 200 with a peripheral circuit such as an analog power supply circuit, a digital power supply circuit, a voltage buffer circuit, a shutter circuit, a shutter drive circuit, etc.

In one embodiment, the peripheral chip 230 may include one or two of a digital signal processor chip and a memory chip. In other embodiments, the peripheral chip may also include chips with other functional types.

For convenience of illustration, only one peripheral chip 230 may be shown in FIG. 9, but the number of the peripheral chips 230 may be not limited to one.

The peripheral chip 230 may usually be a silicon-based chip, which may be fabricated using the integrated circuit fabrication technology. The soldering pad of the peripheral chip 230 may be used for the electrical connection between the peripheral chip 230 and other chips or components. In one embodiment, the peripheral chip 230 may include the second chip soldering pad 235.

In one embodiment, the second chip soldering pad 235 may face toward the optical filter 400, so the second chip soldering pad 235 and the first chip soldering pads 220 may be located on the same side, so it will be convenient to implement the electrical connection between the peripheral chip 230 and the photosensitive chip 200. Correspondingly, the second chip soldering pad 235 may face away from the bottom surface of the encapsulation layer 350.

The passive component 240 may be used to play a specific role in the photosensitive function of the photosensitive chip 200. The passive component 240 may include smaller electronic components such as resistors, capacitors, inductors, diodes, triodes, potentiometers, relays or drivers. For convenience of illustration, only one passive component 240 may be shown in FIG. 9, but the number of the passive components 240 may be not limited to one.

The soldering pad of the passive component 240 may be used for the electrical connection between the passive component 240 and other chips or components. In one embodiment, the soldering pad of the passive component 240 may be the electrode 245.

It can be seen form the above-mentioned analysis that, when the first chip soldering pads 220 face toward the optical filter 400, the electrode 245 may face toward the optical filter 400, which may facilitate the electrical connection between the passive component 240 and the photosensitive chip 200. Correspondingly, the electrode 245 may also face away from the bottom surface of the encapsulation layer 350.

In one embodiment, the upper surface of the encapsulation layer 350 may expose the first chip soldering pads 220, the second chip soldering pad 235 and the electrode 245.

It should be noted that, in one embodiment, the soldering pads of the photosensitive chip 200 and the functional components may all face away from the encapsulation layer 350. In other embodiments, according to the actual electrical connection, the soldering pads of the photosensitive chip 201 may face away from the bottom of the encapsulation layer and the soldering pads of the functional components may face toward the bottom of the encapsulation layer; or the soldering pads of the photosensitive chip and the functional components may all face toward the encapsulation layer.

It should be also noted that both the upper and bottom surfaces of the encapsulation layer 350 may expose the photosensitive chip 200 and the functional components. In order to improve the surface flatness of the encapsulation layer 350 and reduce the difficulty of the formation process of the encapsulation layer 350, the functional components and the photosensitive chip 200 may have the same thickness or a relatively small thickness difference, where the thickness of the functional component may be adjusted according to the thickness of the photosensitive chip 200. In one embodiment, the thickness difference between the functional component and the photosensitive chip 200 may be in a range from about −2 μm to about 2 μm.

For example, the thickness difference between the peripheral chip 230 and the photosensitive chip 200 may be in a range from about −2 μm to about 2 μm. The thickness difference between the passive component 240 and the photosensitive chip 200 may be in a range from about −2 μm to about 2 μm.

The circuit board may be omitted and the thickness of the image capturing assembly 260 may be reduced accordingly, so the photosensitive chip 200 and the peripheral chip 230 may not need to be thinned during the packaging process of the image capturing assembly 260. Compared with the photosensitive chip and peripheral chip in the current lens module, in one embodiment, the photosensitive chip 200 and the peripheral chip 230 may have relatively large thickness, which may improve the mechanical strength and reliability of the photosensitive chip 200 and the peripheral chip 230, and also improve the reliability of the lens module. In other embodiments, the thickness of the photosensitive chip and the peripheral chip may be appropriately thinned according to the process requirements, but the thinning amount may be relatively small to ensure that the mechanical strength and reliability may not be affected.

In one embodiment, the image capturing assembly 260 may further include: the lead wire 500 which may electrically connect the photosensitive chip 200 with the soldering pads of the functional components.

The lead wire 500 may be used to implement electrical integration of the image capturing assembly 260. In one embodiment, the lead wire 500 may be formed by the wire bonding process. The lead wire 500 may be a metal wire such as a gold wire or an aluminum wire. For example, the lead wire 500 may electrically connect the first chip soldering pads 220, the second chip soldering pad 235 and the electrode 245.

It should be noted that the first chip soldering pads 220, the second chip soldering pad 235 and the electrode 245 may be located on the same side of the encapsulation layer 350 and may all face away from the bottom of the encapsulation layer 350, so the lead wire 500 may be located on the top side of the encapsulation layer 350.

After the image capturing assembly 260 and the lens assembly are assembled to obtain a lens module, the lead wire 500 may be located in a holder of the lens assembly, so the lead wire 500 may be protected, which may be advantageous to improve the reliability of the lens module and be convenient to assembly the lens module in the electronic device.

It should be noted that, the image capturing assembly 260 may further include an FPC board 510 which may be mounted on the encapsulation layer 350. The FPC board 510 may be used to implement the electrical connection between the image capturing assembly 260 and the lens assembly, and also the electrical connection between the lens module and other components without using a circuit board. The lens module may be also electrically connected with other components in the electronic device through the FPC board 510, which may implement normal image capturing function of the electronic device.

The lead wire 500 may be used to electrically connect the photosensitive chip 200 with the FPC board 510, so the lead wire 500 may be used to implement the electrical connection between the photosensitive chip 200, the functional components and the FPC board 510. For example, the lead wire 500 may electrically connect the first chip soldering pads 220 with the FPC board 510.

In one embodiment, the connector 520 may be formed on the FPC board 510. When the lens module is applied to an electronic device, the connector 520 may be electrically connected to the mother board of the electronic device, so the information transmission between the lens module and other components in the electronic device may be achieved and image information of the lens module may be transmitted to the electronic device. For example, the connector 520 may be a gold finger connector.

FIG. 11 illustrate a structural schematic corresponding to another exemplary image capturing assembly of the present disclosure.

The similarity between one embodiment and the previous embodiments may be not described herein. The difference between one embodiment and the previous embodiments is: the bottom surface of the encapsulation layer 350a may expose the photosensitive chip 200a and the functional components (not labeled); and the upper surface of the encapsulation layer 350a may be higher than the photosensitive chip 200a and the functional components and may expose the optical filter 400a.

After the photosensitive chip 200a and the optical filter 400a are mounted, the photosensitive unit may be formed. In one embodiment, the encapsulation layer 350a may cover the sidewalls of the optical filter 400a, so the sealing property of the cavity in the photosensitive unit may be improved, the probability of water vapor, oxidizing gas, etc. entering the cavity may be reduced, and the performance of the photosensitive chip 200a may be ensured.

Correspondingly, in order to reduce the stress generated by the encapsulation layer 350a on the optical filter 400a, the method may further include: the stress buffer layer 420a on the sidewalls of the optical filter 400a and the encapsulation layer 350a.

In one embodiment, the material of the stress buffer layer 420a may be an epoxy adhesive.

In one embodiment, the encapsulation layer 350a may cover the photosensitive chip 200a and the functional components, so the redistribution layer structure 360a may be used to electrically connect the soldering pads of the photosensitive chip 200a with the soldering pads of the functional components (not labeled). The redistribution layer structure 360a may be located on a side of the encapsulation layer 350a adjacent to the optical filter 400a.

For example, the redistribution layer structure 360a may include: conductive columns 362a, which may be located in the encapsulation layer 350a and may electrically connect the soldering pads of the photosensitive chip 200a with the soldering pads of the functional components (not labeled); and interconnect lines 361a, which may be located on the encapsulation layer 350a and may be connected to the conductive columns 362a.

A detailed description of the image capturing assembly may refer to the corresponding description of the previous embodiments, and details may not be described herein.

FIG. 13 illustrate a structural schematic corresponding to another exemplary image capturing assembly of the present disclosure.

The similarity between one embodiment and the previous embodiments may be not described herein. The difference between one embodiment and the previous embodiments is: the image capturing assembly may include the redistribution layer structure 360b which can electrically connect the photosensitive chip 200b with functional components (not labeled).

In one embodiment, the upper and bottom surfaces of the encapsulation layer 350b may expose the photosensitive chip 200b and the functional components. The soldering pads of the photosensitive chip 200b and the soldering pads of the functional components may face away from the bottom surface of the encapsulation layer 350b, so the redistribution layer structure 360b may be located on the top side of the encapsulation layer 350b.

For example, the redistribution layer structure 360b may include: the conductive bumps 365b which are respectively on the soldering pads of the photosensitive chip 200b and the soldering pads of the functional components; and the interconnect lines 361b which are on the conductive bumps 365b. The interconnect lines 361b and the conductive bumps 365b may constitute the redistribution layer structure 360b.

The conductive bumps 365b may protrude from the surface of the photosensitive chip 200b and the functional components, which may be advantageous to improve the reliability of the electrical connection between each soldering pad and the interconnect lines 361b. In one embodiment, the conductive bumps 365b may be soldering balls.

A detailed description of the image capturing assembly may refer to the corresponding description of the previous embodiments, and details may not be described herein.

FIG. 16 illustrate a structural schematic corresponding to another exemplary image capturing assembly of the present disclosure.

The similarity between one embodiment and the previous embodiments may be not described herein. The difference between one embodiment and the previous embodiments is: the redistribution layer structure 360c may be located on the bottom side of the encapsulation layer 350c.

In one embodiment, the bottom side of the encapsulation layer 350c may expose the photosensitive chip 200c and the functional components (not labeled). The upper surface of the encapsulation layer 350c may be higher than the photosensitive chip 200c and the functional components and may cover the sidewalls of the optical filter 400c. The soldering pads of the photosensitive chip 200c may face away from the bottom surface of the encapsulation layer 350c and the soldering pads of the functional components may face toward the bottom surface of the encapsulation layer 350c.

Correspondingly, the redistribution layer structure 360c may include: the conductive columns 280c in the photosensitive chip 200c, which may electrically connect the soldering pads of the photosensitive chip 200c; and the interconnect lines 361c on the bottom surface of the encapsulation layer 350c, which may electrically connect the soldering pads of the functional components with the conductive columns 280c. The interconnect lines 361c and the conductive columns 280c may constitute the redistribution layer structure 360c.

In other embodiments, the soldering pads of the photosensitive chip may also face toward the bottom surface of the encapsulation layer. The redistribution layer structure may not include the conductive columns.

A detailed description of the image capturing assembly may refer to the corresponding description of the previous embodiments, and details may not be described herein.

Figure 17:
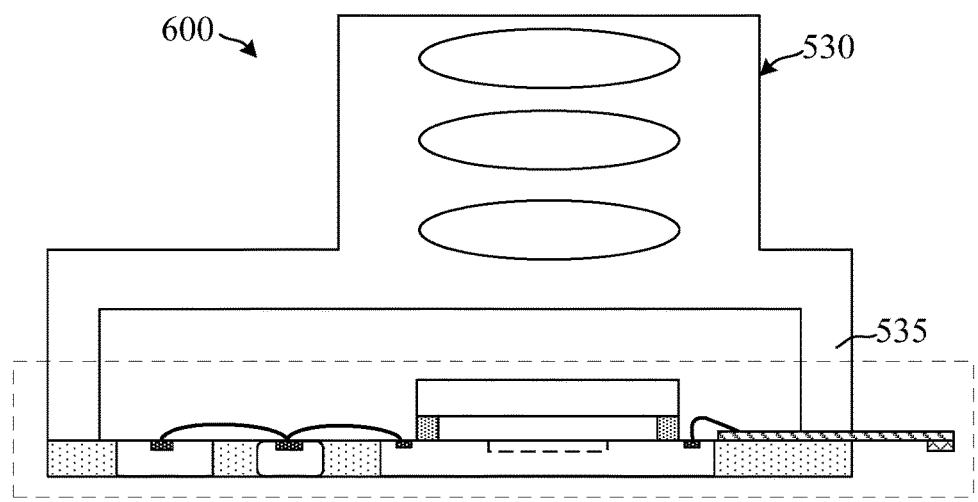
FIG. 17 illustrates a structural schematic corresponding to an exemplary lens module of the present disclosure.

Correspondingly, the present disclosure may further provide a lens module. FIG. 17 illustrates a structural schematic of an exemplary lens module of the present disclosure.

The lens module may include: an image capturing assembly according to embodiments of the present disclosure (shown by the dotted circle in FIG. 17); and a lens assembly 530 including a holder 535, where the holder 535 may be mounted on the front surface of the encapsulation layer (not labeled) and may surround the photosensitive unit (not labeled) and the functional components (not labeled), and the lens assembly 530 may electrically connect the photosensitive chip (not labeled) with the functional components.

The lens assembly 530 may include the holder 535, a motor (not shown) mounted on the holder 535, and a lens group (not labeled) mounted on the motor. By using the holder 535, the installation of the lens assembly 530 and the image capturing assembly may be implemented and the lens group may be on the photosensitive path of the photosensitive unit.

In one embodiment, the thickness of the image capturing assembly may be relatively small, and the thickness of the lens assembly 530 may be reduced by the encapsulation layer, so the total thickness of the lens module 600 may be reduced.

In addition, compared with the method of mounting the functional components on the peripheral motherboard, the photosensitive unit and the functional components may be positioned inside the holder 535, which may reduce a distance between the photosensitive chip and functional components, reduce the size of the lens module 600 accordingly and shorten the distance of the electrical connection between the photosensitive chip and each functional component. In such way, it may further improve the rate of signal transmission and the performance of the lens modules 600 (e.g., improve image capturing speed and storage speed).

In one embodiment, the image capturing assembly may further include FPC board, so the electrical connection between the motor in the lens assembly 530 and the FPC board may be implemented. In such way, the electrical connection between the image capturing assembly and the lens assembly 530 may be implemented.

It should be noted that, a detailed description of the image capturing assembly may refer to the corresponding description of above-mentioned embodiments, and details may not be described herein.

Figure 18:
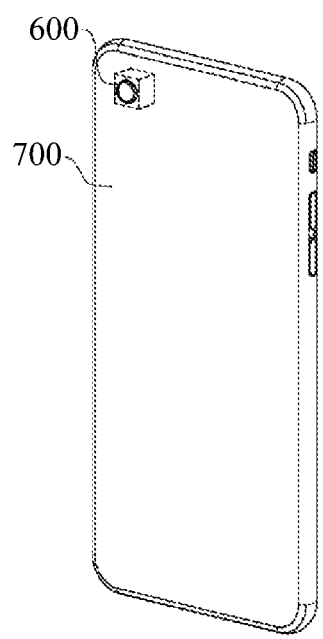
FIG. 18 illustrates a structural schematic corresponding to an exemplary electronic device of the present disclosure.

Correspondingly, the present disclosure may also provide an electronic device. FIG. 18 illustrates a structural schematic of an exemplary electronic device of the present disclosure.

In one embodiment, the electronic device 700 may include the lens module 600 according to the embodiments of the present disclosure.

The reliability and performance of the lens module 600 may be relatively high, so the image capturing quality, image capturing speed and storage speed of the electronic device 700 may be improved correspondingly.

In addition, the total thickness of the lens module 600 may be relatively small, which may be advantageous to improve user experience.

For example, the electronic device 700 may be various image capturing devices such as a mobile phone, a tablet computer, a camera or a video camera.

As disclosed, the technical solutions of the present disclosure have the following advantages.

The present disclosure provides a method including: integrating photosensitive chips and functional components into an encapsulation layer, where, compared with the method of mounting the peripheral chip on the peripheral motherboard, the present disclosure may reduce a distance between the photosensitive chip and the functional component and correspondingly reduce a distance of an electrical connection between the photosensitive chip and the functional component, and further improve the rate of signal transmission and the operational performance of the lens modules (e.g., improve image capturing speed and storage speed); and omitting the circuit boards (e.g., PCB) through the encapsulation layer, which may reduce the total thickness of the lens modules and meet the requirements of miniaturization and ultra-thin thickness of the lens modules.

Optionally, the wire bonding process may be used to electrically connect the soldering pads of the photosensitive chip and the functional components, which may improve the compatibility of the electrical connection process and the current encapsulation process and may also reduce the packaging cost.

The present disclosure integrates the photosensitive chip and the functional components into the encapsulation layer to omit a circuit board, which reduces a total thickness of the lens module, shortens a distance between the photosensitive chip and the functional component, correspondingly shortens a distance of an electrical connection, and further improves a rate of signal transmission and the operational performance of the lens module.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for packaging an image capturing assembly, comprising:
    providing a photosensitive chip;
    mounting an optical filter on the photosensitive chip;
    providing a carrier substrate and temporarily bonding the photosensitive chip and functional components on the carrier substrate; and
    forming an encapsulation layer on the carrier substrate and at least between the photosensitive chip and the functional components,
    wherein the encapsulation layer is formed at least exposing a top surface of the functional components, the functional components including at least one of a peripheral chip and a passive component, and the optical filter is disposed over a top surface of the encapsulation layer,
    wherein each of the photosensitive chip and the functional components includes a soldering pad, and the encapsulation layer is formed to expose the soldering pad,
    the method further including:
    after forming the encapsulation layer, forming, by a wire bonding process, a lead wire of the soldering pad for an electrical connection, and before performing the wire bonding process, mounting a flexible printed circuit (FPC) board on the encapsulation layer, wherein, after performing the wire bonding process, the lead wire is further electrically connected with the photosensitive chip and the FPC board.

2. The method according to claim 1, wherein:
each of the photosensitive chip and the functional components includes a soldering pad, and when temporarily bonding the photosensitive chip and the functional components,
the soldering pad faces away from the carrier substrate; or
the soldering pad of the photosensitive chip faces away from the carrier substrate and the soldering pad of each of the functional components faces toward the carrier substrate; or
the soldering pad faces toward the carrier substrate.

3. The method according to claim 1, wherein:
the encapsulation layer is formed, filling openings between any adjacent components including the photosensitive chip and the functional components.

4. The method according to claim 1, wherein:
the soldering pad faces away from the carrier substrate when temporary bonding the photosensitive chip and the functional components;
the encapsulation layer is formed between the photosensitive chip and the functional components; and
the wire bonding process is performed on a side of the encapsulation layer adjacent to the optical filter.

5. The method according to claim 1, wherein forming the encapsulation layer includes:
after temporary bonding the photosensitive chip and the functional components on the carrier substrate, positioning the carrier substrate into a mold,
wherein the mold has an upper mold and a lower mold, each having a trench formed there-in, and
the carrier substrate is positioned between the upper mold and the lower mold;
clamping the upper mold and the lower mold together, such that the mold is pressed onto the photosensitive chip, the functional components and the carrier substrate to position the optical filter in the trench and to form a cavity between the upper mold and the lower mold;
injecting a molding material into the cavity to form the encapsulation layer; and
removing the mold.

6. The method according to claim 1, further including:
after forming the encapsulation layer, debonding the carrier substrate from the encapsulation layer.

7. The method according to claim 1, further including:
after performing the wire bonding process, debonding the carrier substrate from the encapsulation layer; or
after forming the encapsulation layer and before performing the wire bonding process, debonding the carrier substrate from the encapsulation layer.

8. The method according to claim 1, wherein:
a thickness difference between the functional components and the photosensitive chip is in a range from about −2 µm to about 2 µm.

9. The method according to claim 1, further including:
using a temporary bonding layer to temporarily bond the photosensitive chip and the functional components on the carrier substrate.

10. A method for packaging an image capturing assembly, comprising:
providing a photosensitive chip;
mounting an optical filter on the photosensitive chip;
providing a carrier substrate and temporarily bonding the photosensitive chip and functional components on the carrier substrate; and
forming an encapsulation layer on the carrier substrate and at least between the photosensitive chip and the functional components, wherein
the encapsulation layer is formed exposing a top surface and a bottom surface of the functional components, the functional components including at least one of a peripheral chip and a passive component and all having the top surface coplanar with a top surface of the encapsulation layer and all having the bottom surface coplanar with a bottom surface of the encapsulation layer,
the photosensitive chip has a top surface and a bottom surface coplanar with the top surface and a bottom surface of the encapsulation layer, respectively, and
the optical filter is disposed over the top surface of the encapsulation layer.

11. The method according to claim 10, wherein:
the encapsulation layer is formed further exposing a top surface and a bottom surface of the photosensitive chip.

12. The method according to claim 10, wherein:
each of the photosensitive chip and the functional components includes one or more soldering pads on a corresponding surface that faces away from the carrier substrate.

13. The method according to claim 12, further including:
forming a redistribution layer (RDL) structure on a side of the encapsulation layer adjacent to the optical filter to electrically connect to the one or more soldering pads of the photosensitive chip and the functional components.

* * * * *